(12) United States Patent
Richter et al.

(10) Patent No.: US 9,255,965 B2
(45) Date of Patent: Feb. 9, 2016

(54) SYSTEM FOR POST-PROCESSSING OF ELECTRONIC COMPONENTS

(71) Applicant: Multitest Elektronische Systeme GmbH, Rosenheim (DE)

(72) Inventors: Reinhart Richter, Brunntal/Hofolding (DE); Andreas Nagy, Munich (DE); Bernhard Lorenz, Marzling (DE); Max Schaule, Mindelheim (DE); Stefan Kurz, Rosenheim (DE); Thomas Hofmann, Stephanskirchen (DE); Helmut Scheibenzuber, Feldkirchen-Westerham (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 204 days.

(21) Appl. No.: 14/184,606

(22) Filed: Feb. 19, 2014

(65) Prior Publication Data
US 2014/0167798 A1  Jun. 19, 2014

Related U.S. Application Data

(63) Continuation of application No. 12/859,059, filed on Aug. 18, 2010, now Pat. No. 8,717,048.

(60) Provisional application No. 61/234,961, filed on Aug. 18, 2009.

(51) Int. Cl.
*G01R 31/28* (2006.01)
*G01R 1/04* (2006.01)

(52) U.S. Cl.
CPC .......... *G01R 31/2886* (2013.01); *G01R 1/0425* (2013.01); *G01R 31/286* (2013.01); *G01R 31/2893* (2013.01); *Y10T 29/49998* (2015.01)

(58) Field of Classification Search
CPC ............................ G01R 31/2886; G01R 31/286
USPC ....................................................... 324/750.05
See application file for complete search history.

(56) References Cited

U.S. PATENT DOCUMENTS

| 4,427,249 A | 1/1984 | Bright et al. |
| 5,215,472 A | 6/1993 | DelPrete et al. |

(Continued)

FOREIGN PATENT DOCUMENTS

| CN | 1841693 A | 10/2006 |
| EP | 0 844 655 A2 | 5/1998 |

(Continued)

OTHER PUBLICATIONS

European Search Report dated Jul. 6, 2011 for European Patent Application No. 10171344.4, 3 pages.

(Continued)

*Primary Examiner* — Thomas F Valone
(74) *Attorney, Agent, or Firm* — Christie, Parker & Hale, LLP

(57) ABSTRACT

A method of post-processing a plurality of electronic components in a post-processing machine after fabrication of the electronic components including providing a carrier with align fixtures, which align fixtures have a clamping mechanism, actuating the clamping mechanism to enlarge a size of receptacles, each of the receptacles is assigned to one of the align fixtures and the enlarged receptacles are larger than the electronic components to be received, positioning the electronic components in the receptacles of the align fixtures, actuating the clamping mechanism to reduce a size of the receptacles so that the electronic components are aligned within the receptacles of the carrier, placing the carrier in the post processing machine, and subjecting the electronic components to operations of the post-processing machine while the electronic components maintain in aligned positions in the receptacles of the carrier.

2 Claims, 5 Drawing Sheets

(56) References Cited

U.S. PATENT DOCUMENTS

| | | | |
|---|---|---|---|
| 5,596,229 | A | 1/1997 | Simon |
| 5,872,458 | A | 2/1999 | Boardman et al. |
| 6,111,417 | A | 8/2000 | Kojima |
| 6,268,740 | B1 | 7/2001 | Iida |
| 6,404,638 | B1 | 6/2002 | Messina |
| 6,764,272 | B1 | 7/2004 | Nuxoll et al. |
| 7,129,726 | B2 | 10/2006 | Tashiro et al. |
| 7,156,680 | B2 | 1/2007 | Saito |
| 7,365,558 | B2 | 4/2008 | Bjork |
| 7,410,363 | B1 | 8/2008 | Gattuso et al. |
| 7,514,946 | B2 | 4/2009 | Soeta et al. |
| 7,591,066 | B2 | 9/2009 | Wu et al. |
| 7,733,106 | B2 | 6/2010 | Dozier, II et al. |
| 7,915,057 | B2 | 3/2011 | Takahashi |
| 7,956,627 | B2 | 6/2011 | Kasukabe et al. |
| 7,960,992 | B2 | 6/2011 | Co et al. |
| 7,985,625 | B2 | 7/2011 | Yamaguchi et al. |
| 2001/0055825 | A1 | 12/2001 | Corbett |
| 2003/0017629 | A1 | 1/2003 | Tsui et al. |
| 2003/0102016 | A1 | 6/2003 | Bouchard |
| 2005/0202597 | A1 | 9/2005 | Takahashi |
| 2006/0154386 | A1 | 7/2006 | Cheng et al. |
| 2006/0208721 | A1 | 9/2006 | Soeta et al. |
| 2006/0220667 | A1 | 10/2006 | Tashiro et al. |
| 2006/0290369 | A1 | 12/2006 | Yamashita et al. |
| 2007/0285106 | A1 | 12/2007 | Henry et al. |
| 2008/0238460 | A1 | 10/2008 | Kress et al. |
| 2008/0253103 | A1 | 10/2008 | Takahashi |
| 2009/0294965 | A1 | 12/2009 | Takahashi |
| 2011/0043982 | A1* | 2/2011 | Poetzinger ........... G01R 1/0425 361/679.01 |

FOREIGN PATENT DOCUMENTS

| | | |
|---|---|---|
| EP | 2 302 399 A2 | 3/2011 |
| JP | 49-82967 | 8/1974 |
| JP | H04-096845 | 8/1992 |
| JP | 06-124981 | 5/1994 |
| JP | 09-040068 | 2/1997 |
| JP | 10-163237 | 6/1998 |
| JP | 10-284878 | 10/1998 |
| JP | 11-195895 | 7/1999 |
| JP | 2000-049210 | 2/2000 |
| JP | 2002-25732 | 1/2002 |
| JP | 2005-26499 | 1/2005 |
| JP | 2006-284384 | 10/2006 |
| JP | 2007-106799 | 4/2007 |
| WO | WO 2004/106944 | 12/2004 |
| WO | WO 2009/100910 A1 | 8/2009 |

OTHER PUBLICATIONS

Anonymous: "Airjaw centering device," Research Disclosure, Mason Publications, vol. 324, No. 49, Apr. 1, 1991 (1 page).

English Translation of Japanese Office action dated Mar. 26, 2012 for Japanese Patent Application No. 2010-181844, date of mailing Apr. 3, 2012, 6 pages.

KIPO Notification of Ex Officio Provisional Refusal dated Oct. 28, 2011, for Korean Application No. 10-2010-0080027, 5 pages.

Japanese Office action dated Jul. 28, 2011, for Japanese Patent Application No. 2010-181846, date of mailing Aug. 2, 2011, with English Translation of same, 6 pages.

KIPO Office action dated Jan. 18, 2012 for Korean Application No. 10-2010-0080028, 5 pages.

English Translation of Japanese Office action dated Nov. 22, 2012 for Japanese Patent Application No. 2010-181849, date of mailing Nov. 27, 2012, 2 pages.

\* cited by examiner

SYSTEM FOR POST-PROCESSSING OF ELECTRONIC COMPONENTS

CROSS-REFERENCE TO RELATED APPLICATION(S)

This present application is a continuation of U.S. application Ser. No. 12/859,059, filed on Aug. 18, 2010, which claims the benefit of U.S. Provisional Patent Application No. 61/234,961, filed on Aug. 18, 2009 in the United States Patent and Trademark Office, the entire content of which is incorporated herein by reference.

FIELD OF THE INVENTION

The invention relates to a method of post-processing multiple electronic components.

Moreover, the invention relates a post-processing line.

BACKGROUND OF THE INVENTION

Integrated circuits are usually fabricated on semiconductor wafers. The integrated circuits have a variety of uses and can be found in versatile electric devices. Depending on the purposes they are made for the integrated circuits and other electronic components such as resistors, capacitances and inductances are packaged, marked and tested before being assembled. For example, MEMS (micro electro mechanical system) components are tested under given temperatures, pressure, angles of inclination and different types of accelerations. Hence, the complete manufacturing of electronic components can be divided into processes of pure fabrication and a process after finishing the contact patterns of the electronic components. There are two types of machine which handle electronic components the so called "Gravity handler" and "Pick & Place-Handler" handling singulated electronic components and the "Strip handler" which handle so called strips.

U.S. Pat. No. 5,872,458 A discloses a method for electrically contacting semiconductor devices in trays and test contactor useful therefor, wherein semiconductor devices are tested or burned-in while in a handling or shipping tray using a test contactor which engages either a cell of the tray or the device itself during testing. A tray having a plurality of devices is moved by a handling system in an initial alignment operation where one or more devices is generally aligned beneath the test contactor. Then, the tray or the test contactor is moved in a vertical direction so that engagement features of the test contactor engage either the tray cell or the device to be tested to bring the device into final alignment for testing. Upon final alignment, contacts of the test contactor physically and electrically contact leads and in-tray testing of the devices is performed. In-tray testing reduces manufacturing cycle and minimizes device lead damage by eliminating pick and place handling of the devices at test.

OBJECT AND SUMMARY OF THE INVENTION

There may be a need for a system capable of post-processing multiple electronic components in an efficient way.

In order to achieve the object defined above, a method of post-processing multiple electronic components, and a line adapted for applying a post-processing method having the features according to the independent claims are provided.

According to an exemplary embodiment of the invention, a method of post-processing a plurality of electronic components in a post-processing machine after fabrication of the electronic components is provided, wherein the method comprises:

providing a carrier with align fixtures, which align fixtures comprise a clamping mechanism, actuating the clamping mechanism to (particularly temporarily) enlarge a size of receptacles wherein each of the receptacles is assigned to one of the align fixtures and wherein the enlarged receptacles are larger than the electronic components (particularly moulded parts such as packaged semiconductor die) to be received, positioning (particularly placing) the electronic components in the receptacles of the align fixtures (particularly after exposing the openings), actuating the clamping mechanism to reduce a size of the receptacles so that the electronic components are aligned within the receptacles of the carrier (particularly after positioning), placing the carrier in the post-processing machine, subjecting the electronic components to one or more operations of the post-processing machine while the electronic components maintain in aligned positions in the receptacles of the carrier.

According to another exemplary embodiment of the invention, an assembly line (particularly a post processing line for executing a post-fabrication process flow defining a path of operations such as tests to be performed with readily manufactured electronic components) for post-processing of multiple electronic components is provided, wherein the assembly line comprises a number (for instance one or more, or more specifically an arbitrary selection) of post-processing machines applying the above mentioned post-processing method.

The term "post-processing" may particularly denote processing performed after finishing fabrication of the electronic components, particularly after finishing contact-pattern in semiconductor device fabrication. In post-processing the electronic devices may be subjected to machines of types which operate processes such as laser marking, burn-in, bake-in, final test and selective marking. However, the processes of post-processing are not limited to this listing of operations on electronic components (particularly semiconductor devices). Post-processing may denote processes performed after finishing the contact pattern of the semiconductor devices.

The term "electronic component" may particularly denote any component adapted for being mounted on an electronic support substrate such as a printed circuit board. Such electronic components may also be handled by a handling machine, the so called "handler". There are electronic devices that have electrical leads extending from the body of the package. In this case the term "electronic component" may particularly refer to the body of the package. Examples for electronic components are electronic chips, i.e. packaged dies or naked unpackaged dies.

The term "carrier" may particularly denote a device that carries multiple electronic components at a time. A carrier may be a strip-like member adapted for carrying multiple electronic components in receptacles of the carrier. Such a carrier may be formed as a layer sequence of multiple laminated plates such as processed (for example patterned) metal sheets. Such a carrier may be used in conjunction with a handler allowing to handle the electronic devices using the carrier for subsequently carrying out a test (such as a function test) of the electronic components.

The term "align fixture" may particularly denote a portion of a carrier for supporting a physical structure during machining or handling. A "physical structure" may in this context particularly denote the material, piece of material or electronic component that is operated upon at any stage in the process of manufacture or handling.

The term "align" may particularly denote that something is ranged or lined up. E.g. an electronic component may be aligned with a fixed or a flexible abutting section. The term "align" may particularly denote that electronic components are placed or arranged in a correct position.

The term "clamp" may particularly denote that the carrier is designed to have parts brought together for holding or compressing the electronic components. The parts which may be brought together may be a first abutting sections and a second abutting sections. The clamping may be elastically. The term "elastic" may particularly denote that a force may be exerted which is particularly flexible, resilient or springy such as a Hook force.

The term "receptacle" may particularly denote a structure designed to receive and contain something or may more particularly denote a container for an electronic component.

The term "post-processing line" may particularly denote an arrangement of machines or machine sections succeeding manufacturing. A post-processing line may sequentially occur on various stages of production or test of electronic components. The term "post-processing of electronic components" may denote an arrangement of machines or machine sections in manufacturing of semiconductors after finishing contact pattern of the semiconductors.

According to an exemplary embodiment of the invention, a method of post-processing electronic components may be provided, wherein the electronic components may be placed in enlarged receptacles of a carrier and thereupon may be elastically clamped and aligned by the clamping mechanism in a reduced size of the receptacles. The carrier may be put into a post-processing machine. While the electronic components are clamped and aligned in the receptacles the electronic components may be subjected to operations of the post-processing machine.

A method of post-processing may particularly denote a process of evaluation or test of electronic components. Hence, a post-processing machine may particularly denote a machine for evaluating or testing of electronic components. During post-processing the electronic components may be subjected under various physical conditions to get information about the quality of the electronic components or only to subject the electronic components under special conditions. Post-processing may particularly denote or end up in a quality test or a quality evaluation of the electronic components by subjecting the electronic components under the various electrical and/or mechanical conditions of interest.

In the following, further exemplary embodiments of the method will be described. However, these embodiments also apply to the line.

The method may further comprise elastically clamping the electronic components by the clamping mechanism exclusively on side sections of the electronic components. The electronic components may be semiconductor components and may have a cuboid shape with six different surfaces. The main surfaces, the so called symbol sides and the parallel contact sides, may denote main planes of the semiconductor components due to that it is usually the symbol side and the contact side having a greater extension than the remaining four side sections of the semiconductor component. Thus, the height of the electronic component denoted by the height of the side sections of the electronic component may be smaller than the both sides of the main surfaces. The force to clamp the electronic components may be provided on the side sections of the electronic components. Thus, the forces of the elastic unit may be exerted on the electronic component in a plane in which the electronic may be mostly rugged. By clamping the electronic component on its side sections the symbol side and the contact side may be accessible for further processing such as marking on the symbol side or contacting the contact side.

The method may further comprise providing the carrier with an identifying feature for definite (particularly precise) identification of the carrier. Post-processing machines may form an assembly line. The carriers may be transported from one post-processing machine to a further post-processing machine. A unique identification of each of the carriers in a plant during post-processing enables tracking (particularly tracing) the way of each of the carriers in the plant and enables tracking each of the electronic components. Thus, by the identifying feature each of the carriers and each of the electronic components may be tracked in an assembly line.

The method may further comprise providing the carrier with fiducial marks for fiducial detection. A vision system together with fiducial marks may provide a detection of the position and orientation of the carrier in a post-processing machine. This may be advantageous when operating processes which need accurate alignment of the carrier such as for marking or contacting the electronic components.

The method may comprise providing the receptacles with first abutting sections and second abutting sections, wherein the first abutting sections exert first force components and the second abutting sections exert second force components mutually forming clamping forces on the side sections of the electronic components and wherein the first force components and the second force components are at least partially opposed (particularly are exerted against one another). Each of the electronic components may be aligned in the receptacles assigned to each of the align fixtures. The first abutting sections and the second abutting sections abut on side sections of the electronic components. According to a physical law, the electronic components may rest and be aligned if the forces exerted on each of the electronic components are at least not directed in one direction. The electronic components may rest, by including frictional forces, when the two forces exerted on each of the electronic components by the first abutting sections and the second abutting sections are at least partially opposed.

The method may comprise actuating an actuatable structure located outside of the receptacle in a plan view for enlarging the size of the receptacle. The align fixture may comprise an actuatable structure formed at the first abutting section, wherein the actuatable structure may be actuatable by a corresponding actuation structure (of a handler device or the like) for manipulating the receptacle. The actuatable structure may be for instance a recess, a protrusion, a hole, a pin, etc. which can be actuated by any appropriate force application mechanism (for instance applying a mechanical force, an electric force, a magnetic force, etc.) controlled by the actuation structure. The actuation structure may be configured (for instance shaped and/or dimensioned) correspondingly to the actuatable structure and may be for instance a protrusion or any other force application element which can actuate the actuatable structure using any appropriate force application mechanism (for instance applying a mechanical force, an electric force, a magnetic force, etc.) for controlling the receptacle in a desired way (for instance for temporarily enlarging or reducing an opening thereof). The actuatable structure (particularly an actuatable hole, an actuatable pin or an actuatable arm) may be adapted to be actuated to, in turn, actuate the elastic unit. The actuatable structure may be located besides the receptacle (particularly beside a boundary area of the receptacle). The actuatable structure and the first abutting section may form a stiff member. The actuatable structure may be accessible (by an actuation element controlled by a controller of a handler) from a side from which the electronic component is to be received.

The method may comprise aligning the electronic components with the second abutting sections, wherein the first force is exerted in a self-acting manner by elastic (particularly flexible, resilient or springy) units (particularly a piece or complex of apparatus serving to perform one particular function) to which the first abutting sections are mounted. Each one of the first abutting sections is mounted at least to an assigned one of the elastic units. The elastic units may each exert the first forces towards the second abutting sections. Each one of the second abutting sections is assigned to one of the first abutting sections. The electronic components may be aligned with the second abutting sections.

In particular, the method may comprise actuating an actuatable structure located outside of the receptacle for enlarging the size of the receptacle.

The method may comprise aligning the electronic component wherein the first force components and the second force components are exerted parallel to main planes of the receptacles. The main planes of the receptacles may be defined by being parallel to the orientation of the align fixtures and being parallel to the orientation of the carrier. The electronic component may be aligned in an appropriate way if the forces exerted by the first abutting sections and the second abutting sections are exerted in one plane. The first abutting sections and the second abutting sections abut on side sections of the electronic component. By exerting both the first forces and the second forces in main planes of the receptacles the total forces on the electronic components show no turning moment to flip the electronic components out of the receptacle. The electronic components may be firmly aligned in the receptacles by forces being parallel to the main planes of the receptacles. The transition of the enlarged size of the receptacles to a clamping size of the receptacles may take place in a main plane of the receptacle. The main plane of the receptacle may match with a main plane of the carrier, with a main plane of the electronic component and with a main plane of the align fixture. The expression "main plane" may denote the largest surface of a cuboid body.

In particular, the method may comprise aligning the electronic component so that the first force components and the second force components are exerted parallel to main planes of the electronic components.

The method may comprise forming support surfaces (particularly something to hold up in position by serving as a foundation) by base support sections parallel to main planes of the receptacles. The support forces exerted by the base support sections may act on main planes of the electronic components. The electronic components may be arranged in the receptacles in that the main planes of the receptacles and the main planes of the electronic components may be parallel. The base support sections acting on the electronic components may be parallel to the main planes of the receptacles so that the electronic components are aligned by the support of the base support sections in the main planes of the receptacles. An advantage of supporting the electronic components in the main planes of the electronic components may be that the load on the electronic components may be evenly be distributed on different parts of the main surfaces of the electronic components and that the first forces and the second forces are exerted parallel to the base support section. Thus, the orientation of the first forces and the orientation of the second forces may avoid cracking of the electronic components on the base support sections.

In particular, the method may comprise providing support surfaces for supporting bottom sides of the electronic components by base support sections parallel to main planes of the receptacles.

The method may comprise exerting the support forces by the base support sections perpendicularly to the first forces exerted by the first abutting sections and perpendicularly to the second forces exerted by the second abutting sections. The support forces exerted by the base support sections may align the electronic components perpendicular to their main planes. The technical advantage of the support forces being perpendicular to the forces exerted by the first abutting sections and the second abutting sections may be that there may be an avoidance of a turning moment on the electronic components. The electronic components remain in aligned positions relative to their main planes.

The method may comprise providing self-acting movements of the second abutting sections and/or of the first abutting sections being flexibly mounted via the elastic units parallel to the main planes of the receptacles. The forces exerted by the abutting sections which are flexibly mounted are exerted parallel to the main planes of the receptacles. The forces to align the electronic components may be provided by the elastic units and the elastic units may move the flexibly mounted abutting sections and the electronic components in the main planes of the receptacles by the self-acting movements of the elastic units in the main planes of the receptacles themselves. Thus, the forces of the elastic units may be exerted on the electronic components in planes in which the electronic components are predominantly rugged.

The method may comprise providing a base support plate above which the elastic units are arranged, wherein the elastic units are adapted to perform a movement parallel to a main plane of the receptacles at least partially supported by the base support plate. In one embodiment the base support plate and the elastic units may be arranged parallel to the main planes of the receptacles and parallel to the main planes of the complete align fixtures. The elastic units may move along the base support plate on which the elastic units may be arranged. At least in one direction which may be the direction towards the base support plate the elastic units may be secured against unwanted deformation. The base support plate may be planar or may have recesses adapted to guide the movements of the elastic units.

The method may comprise arranging the elastic units between a base support plate and a receiving plate wherein the elastic units perform a movement in the main planes of the receptacles at least partially guided (particularly directing the motion of something) by the base support plate and the receiving plate. In one embodiment the base support plate, the receiving plate and the elastic units may be arranged parallel to the main planes of the receptacles and parallel to the main planes of the complete align fixtures. The elastic units may move between the base support plate and the receiving plate between which the elastic units may be arranged. The elastic units may be secured against deformation in two directions. The two directions against which the elastic unit may be secured may be the directions towards the base support plate and the direction towards the receiving plate. The base support plate and the receiving plate may be planar or may have recesses adapted to guide the movements of the elastic units.

The method may comprise adjusting thicknesses at least with one thickness adjusting plate mounted at the carrier. For distance adaption purposes the align fixture may comprise even more than three plates.

In particular, the method may further comprise adjusting a thickness of the carrier by mounting at least one thickness adjusting plate to the carrier.

The method may comprise providing a frame, particularly a slidably mounted frame, wherein the first abutting section and the elastic unit are mounted on the slidably mounted frame. Such a frame may be for instance rectangular structure formed by for instance four bars or rods. The first abutting section and the elastic unit may be mounted within an area delimited by the bars or rods. The frame, in turn, may or may not be mounted fixedly or flexibly on an outer support structure such as a plate. In one embodiment, a slidably mounted frame may comprise adjustment units to allow fine adjusting of the aligning performance of the receptacle. The first and second abutting sections may engage the electronic component and may align the electronic component with the first abutting section parallel to a main plane of the receptacle. Furthermore, the first abutting section and the elastic unit on which the second abutting section is mounted may both be mounted on a frame being slidably mounted in the main plane of the receptacle. By providing the slidably mounted frame with adjustment units it may be possible to allow fine adjustment of the receptacle and the electronic component received therein in the align fixture. The slidably mounted frame may be elastically mounted via at least one further elastic unit.

The method may comprise providing at least one of the group consisting of the first abutting section, the second abutting section, the elastic unit, the base support section and the slidably mounted frame at least partially integrally formed from a plate. It may be convenient to manufacture at least one functional element from a plate by using design techniques such as etching techniques or laser techniques. These techniques may be optimally suitable for applying them on thin plates, for instance metal plates or spring metal steel plates. By etching or laser cutting, a high accuracy for the structures being manufactured may be achieved.

The method may comprise providing at least two of the group consisting of the first abutting section, the second abutting section, the elastic unit, the base support section and the slidably mounted frame at least partially integrally formed from one plate. The same advantages cited for integrally forming at least one of the functional elements from one plate hold for forming two ore even more functional elements from one plate. It may be even more convenient to manufacture as many functional elements as possible using one plate. Particularly the abutting section being mounted on the elastic unit and the elastic unit may be formed from one plate. Additionally, the first abutting section may be integrally formed from one plate. Even additionally the slidably mounted frame and the at least one further elastic unit may be manufactured integrally from one plate. Thus, the first abutting section, the second abutting section, the elastic unit, the slidably mounted frame and the at least one further elastic unit may be integrally formed from one plate. When properly adapting the form of the plate it may be even possible to form also the base support section from the same plate.

The method may comprise exerting two force components on at least one of the first abutting sections and the second abutting sections so that this at least one abutting section exerts two angled force components on the electronic components. On one of the two assigned abutting sections the elastic units exert two force components, wherein the respective abutting sections are adapted to transfer the two force components in a manner that these abutting sections exert two angled force components on the electronic component. Two angled sides of the electronic component may be touched by one of the abutting sections which show each two angled forces in order to enable aligning of the electronic components within the receptacles by further arbitrary abutting sections acting only on at least one of the further side sections of the electronic components or one of the further corner regions of the electronic components.

The post-processing may comprise laser marking while the electronic components are held and aligned by the carrier and are moved by handling the carrier. While the electronic components are clamped and aligned in the receptacles the electronic components may be subjected to a laser marking machine. The electronic components may have an accessible symbol side independent of whether the contact side abuts with the base support section or whether the symbol side abuts with the base support section. If the contact sides abut with the base support sections the symbol side lies open to the receiving side and may be subjected to laser marking without any restrictions. If the symbol sides abut with the base support sections the base support sections of the receptacles may have openings in their centres extending so far that the edge regions of the electronic components abut with the base support sections.

The post-processing may comprise a burn-in test while the electronic components are held and aligned by the carrier and are moved by handling the carrier. In a burn-in test the electronic components, especially semiconductor devices, may be subjected to temperatures of up to 200° C. for a fraction of an hour up to several hours. During the burn-in test the electronic components may be additionally subjected to a power test by a current feed or the electronic components may be subjected to an electronic test for testing the electronic quality of the electronic components. The carrier may be adapted to withstand high temperatures by forming the carrier of temperature resistant materials like metal, thermosetting plastics or resins. The carrier may be adapted to fulfil the various electrical and/or mechanical conditions by providing the carrier made from metal (particularly spring metal steel). The carrier may be appropriate for being subjected to mechanical stress, electrical loading and thermal impact in post-processing machines by providing the carrier integrally formed from sheet metal of spring metal steel. The sheet metal may be coated with a variety of coatings for the desired purposes, such as mechanical strength, abrasion resistance and surface resistivity.

The post-processing may comprise a bake-in process while the electronic components are held and aligned by the carrier and are moved by handling the carrier. Forming the carrier from temperature resistant materials may enable the carrier to withstand bake-in processes, wherein the electronic components are subjected to high temperatures for a period of about one hour. The bake-in process may be used to reduce electrical load on the electronic components to further continue with a final test.

The post-processing may comprise a final test on a handler while the electronic components are held and aligned by the carrier and are moved by handling the carrier. The final test of electronic components, e.g. semiconductor devices, may be an electronic functional test and may comprise a variety of physical test conditions, such as a variety of temperatures, pressures, accelerations and inclination angles in an arbitrary combination. Forming the carrier from a material or materials which withstand the mechanical and electronic strain the carrier may be adapted to align the electronic components under these variable conditions and may be adapted to allow for a contacting the contacts of the electronic components.

In an embodiment the post-processing does not comprise a final test on a handler while the electronic components are held and aligned by the carrier and are moved by handling the carrier. After laser marking, burn-in or bake-in directly a selective marking may be operated on the electronic components.

In particular, post-processing may further comprise subjecting the electronic components to the operation of the post-processing machine is free of a final test on a handler while the electronic components are held and aligned by the carrier and are moved by handling the carrier.

The post-processing may comprise a selective marking while the electronic components are held and aligned by the carrier marking and are moved by handling the carrier. With reference to the explanation of the laser marking same is valid for selective marking, e.g. laser marking: The electronic components may have an accessible symbol side independent of whether the contact side abuts with the base support section or whether the symbol side abuts with the base support section. If the contact sides abut with the base support sections the symbol side lies open to the receiving side and may be subjected to laser marking without any restrictions. If the symbol sides abut with the base support sections the base support sections of the receptacles may have openings in their centres extending so far that the edge regions of the electronic components abut with the base support sections. After selective marking the electronic components placed in the carrier may be selectively marked "positive", selectively marked "negative" or may be completely marked either "positive" or "negative". The selective marking may also comprise a mark pointing out a quality feature of the electronic components, e.g. a mark which signs the maximum frequency to operate a semiconductor device.

At least two of the group consisting of laser marking, burn-in test, the bake-in, the final test and the selective marking may be performed without removing the electronic components from the carrier. The carrier may be adapted to withstand a variety of physical conditions and may accurately align the electronic component through complete post-processing. Thus, the electronic components may be held and aligned in the carrier during the complete post-processing or parts of post-processing.

After the post-processing the electronic components may be removed from the post-processing machine by removing the carrier from the post-processing machine while the electronic components are held and aligned by the carrier.

The line, on or with which the above described method may be carried out, may further comprise a fabrication apparatus for fabrication of the electronic components. It may be arranged in a process flow upstream of the number of post-processing machines so that the electronic components are firstly fabricated, and the readily fabricated electronic components are subsequently subjected to the post-processing. For the case of packaged integrated circuits as the electronic components, the fabrication apparatus may comprise the formation of integrated circuit components (such as field effect transistors) on and/or in a semiconductor substrate (for instance a silicon wafer), formation of metallization layer on the processed semiconductor substrate, singularization of the semiconductor substrate into individual electronic chips or dies, and packaging of the singularized electronic chips or dies in a package or mould for formation of the electronic components. After having finished such a manufacture procedure, the electronic components may be made subject of a post-processing procedure in which one or more tests may be performed with the electronic components. Such tests may include electrical tests, mechanical tests, test of thermal stability, functional tests, etc. For efficiently performing such tests, batches of electronic components may be loaded into a carrier by clamping them in individual align fixtures or receptacles thereof.

According to an exemplary embodiment, the line arrangement further comprises a fabrication apparatus for fabrication of the electronic components and being arranged in a process flow upstream of the number of post-processing machines so that the electronic components are firstly fabricated and the readily fabricated electronic components are subsequently subjected to the post-processing.

According to an exemplary embodiment, the clamping mechanism is adapted for elastically clamping the electronic components exclusively on side sections of the electronic components.

According to an exemplary embodiment, the line arrangement comprises an identification unit adapted for definite identification of the carrier.

According to an exemplary embodiment, the actuation unit is adapted for actuating an actuatable structure of the clamping mechanism located outside of the receptacle for enlarging the size of the receptacle.

According to an exemplary embodiment, the post-processing machines comprise a laser marker for laser marking of the electronic components which are held and aligned by the carrier and are moved by handling the carrier.

According to an exemplary embodiment, the post-processing machines comprise a burn-in tester for burn-in testing the electronic components which are held and aligned by the carrier and are moved by handling the carrier.

According to an exemplary embodiment, the post-processing machines comprise a bake-in chamber for baking the electronic components which are held and aligned by the carrier and are moved by handling the carrier.

According to an exemplary embodiment, the post-processing machines comprise a test arrangement for final testing the electronic components which are held and aligned by the carrier and are moved by handling the carrier.

According to an exemplary embodiment, the line arrangement is free of a test arrangement adapted to test the electronic components.

According to an exemplary embodiment, the post-processing machines comprise a selective marker for selective marking while the electronic components are held and aligned by the carrier and are moved by handling the carrier.

According to an exemplary embodiment, the post-processing machines comprise at least two of the group consisting of the laser marking, the burn-in test, the bake-in test, the final test and the selective marking to be performed without removing the electronic components from the carrier.

According to an exemplary embodiment, the post-processing machines are adapted so that the electronic components are removed from the post-processing machines by removing the carrier from the post-processing machines while the electronic components are held and aligned by the carrier.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DETAILED DESCRIPTION OF THE EXEMPLARY EMBODIMENTS

Figure 1:
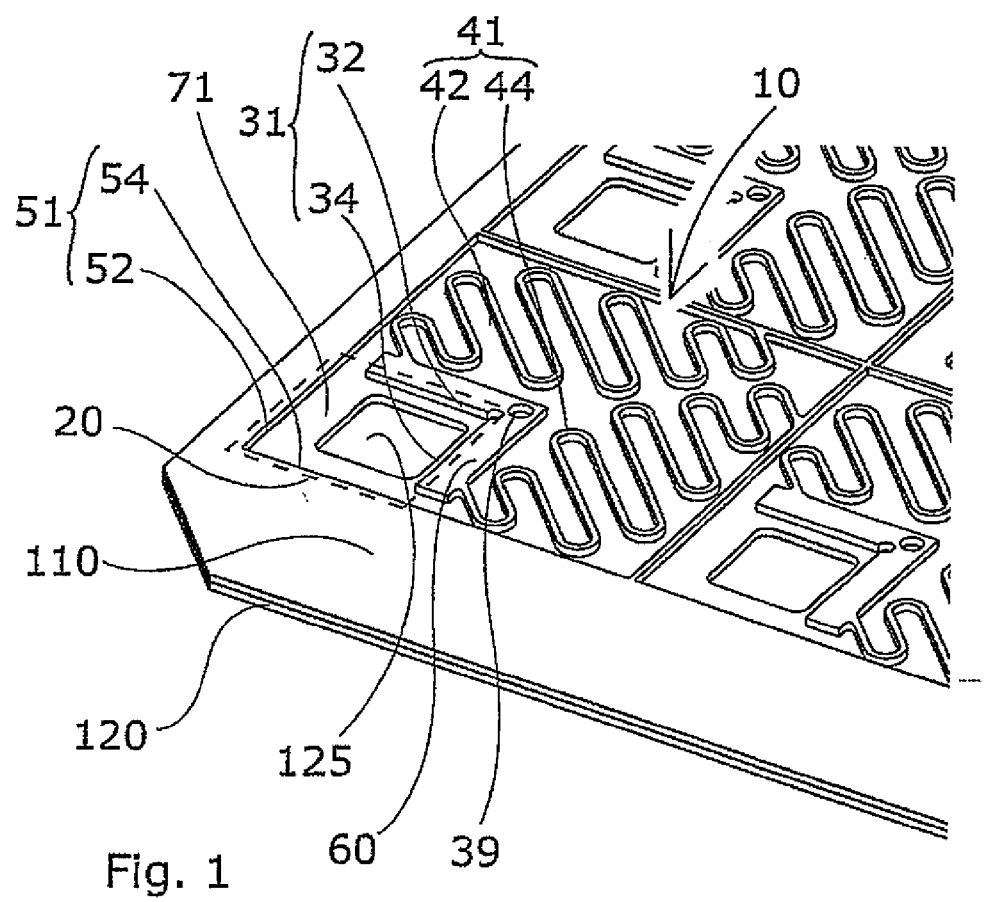
FIG. 1 shows a detailed view of and FIG. 2 shows an overview of a carrier for use in a post-processing method according to an exemplary embodiment of the invention.

The illustration in the drawing is schematically. In different drawings, similar or identical elements are provided with the same reference signs.

FIG. 1 shows a perspective view from above of a detail of an elastic unit plate 110 depicting an align fixture 10. The align fixture 10 comprises a receptacle 20. The receptacle 20 comprises a first abutting section 31, a second abutting section 51 and a base support section 71. The align fixture 10 comprises an elastic unit 41 having a first spring element 42 and a second spring element 44. The first abutting section 31 is mounted at the elastic unit 41. Thus, the first spring element 42 and the second spring element 44 (both configured as a meandrical structure formed out of or integrally with the elastic unit plate 110) allow for an elastic movement of the first abutting section 31. The first abutting section 31 comprises first part 32 and second part 34 being angled with respect to each other and forms a stiff member. By actuating a first abutting section actuation hole 39 with an appropriate actuator such as a pin of a post-processing device/handler device (not shown in FIG. 1), the elastic unit 41 can be brought into a pre-stressed or biased state where the receptacle 20 is enlarged since the first abutting section 31 is moved away from the second abutting section 51. The second abutting section 51 comprises the first part 52 and the second part 54. The first part 32 of the first abutting section 31 lies opposed to the second part 54 of the second abutting section 51. The second part 34 of the first abutting section 31 lies accordingly opposite to the first part 52 of the second abutting section 51. The first abutting section 31 and the second abutting section 51 are therefore adapted to engage an electronic component 1 in a space between them, wherein the elastic unit 41 exerts the force to engage the electronic component 1. In this embodiment the base support section 71 is formed by a base support plate 120. In the space between the first abutting section 31 and the second abutting section the base support plate has an access opening 125. Through this access opening 125 the symbol side of the electronic component 1 is accessible to laser marking. The first abutting section 31, the second abutting section 51 and the elastic unit 41 may be each formed from the elastic unit plate 110. The clamping mechanism may comprise the elastic unit 41, the first abutting section 31 and the second abutting section 51. The clamping mechanism 41, 31, 51 is adapted to engage side sections of the electronic component to be received. The first abutting section 31 and the actuation hole 39 may be integrally formed from an L-shape member 60.

Figure 2:
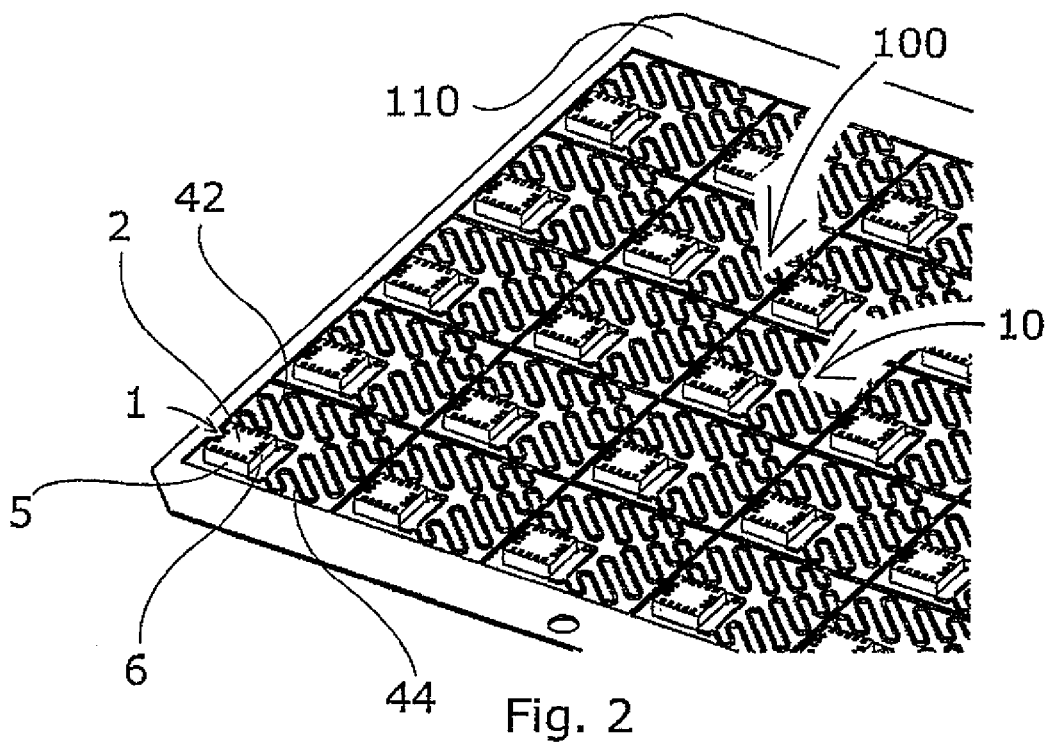

FIG. 2 shows multiple align fixtures 10 of a carrier 100, wherein each of the align fixtures 10 is adapted to align one electronic component 1. The electronic components 1 lie upside down in the receptacles 20 so that a contact side 2, a first side section 5 and a second side section 6 of the electronic component 1 is shown from a perspective view. The first spring elements 42 and the second spring elements 44 formed from the elastic unit plate 110 are depicted.

Figure 3:
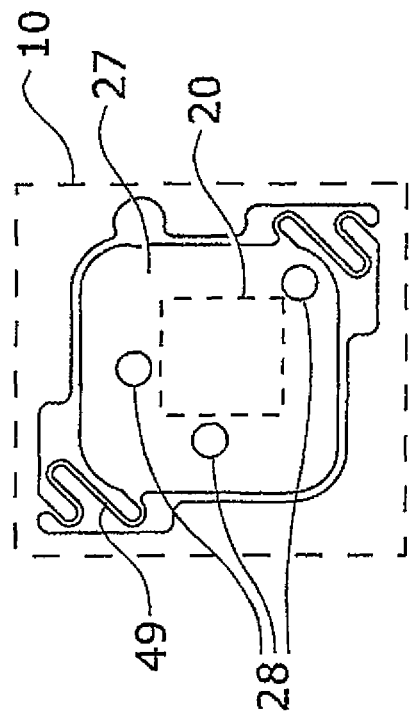
FIG. 3 shows a detailed view of a part of a carrier for use in a post-processing method according to an exemplary embodiment of the invention.

FIG. 3 shows an align fixture 10 comprising a floatable mounted receptacle 20. A floatable mounted frame 27 is floatably mounted via two opposing elastic units 49. The receptacle 20 integrated in the floatable mounted frame 27 is also floatable. Adjustment units 28 arranged on the floatable mounted frame 27 allow for a fine adjustment of the floatable mounted frame 27 and hence for fine adjustment of the receptacle 20. Three adjustment units 28 may allow for a fine adjustment of the receptacle in the main plane of the align fixture 10.

Figure 4:
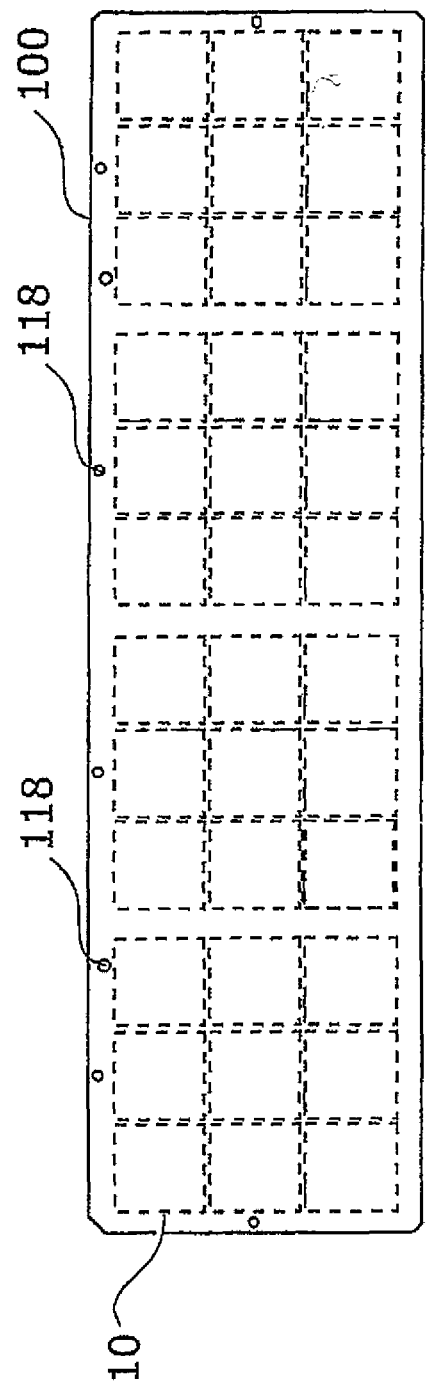
FIG. 4 shows an overview of a carrier for use in a post-processing method according to an exemplary embodiment of the invention.

FIG. 4 shows a schematic view from above of a complete carrier 100 having thirty-six align fixtures arranged in a matrix form of 4×9 align fixtures. Two fiducial elements 118 arranged in the edge region of the carrier 100 may be used to align the carrier 100.

Figure 5:
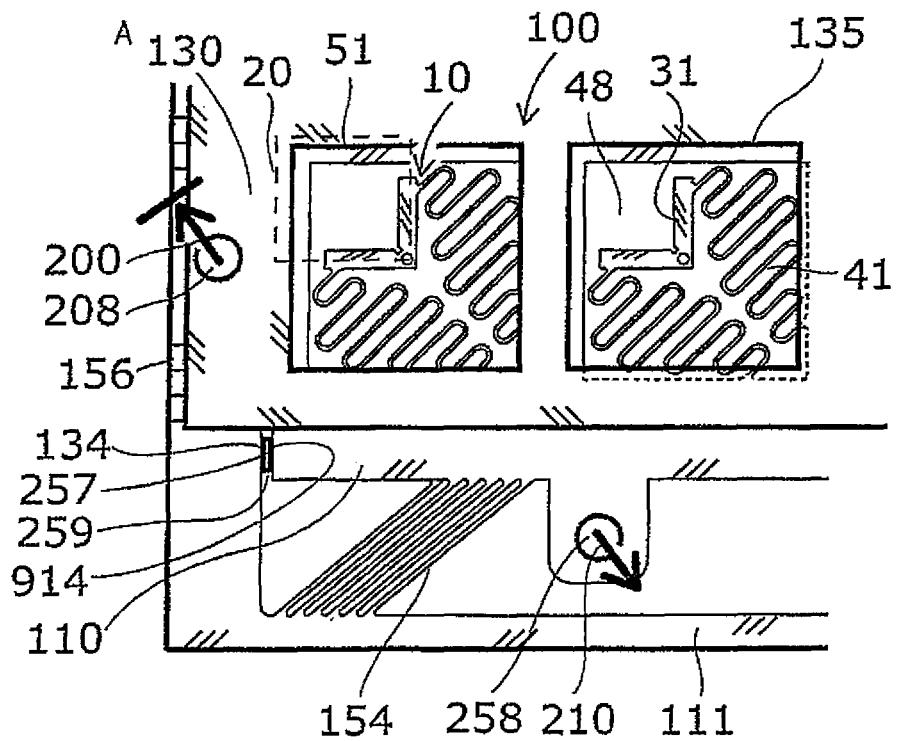
FIG. 5 and FIG. 6 show a detailed view of a carrier for use in a post-processing method according to an exemplary embodiment of the invention.
Figure 6:
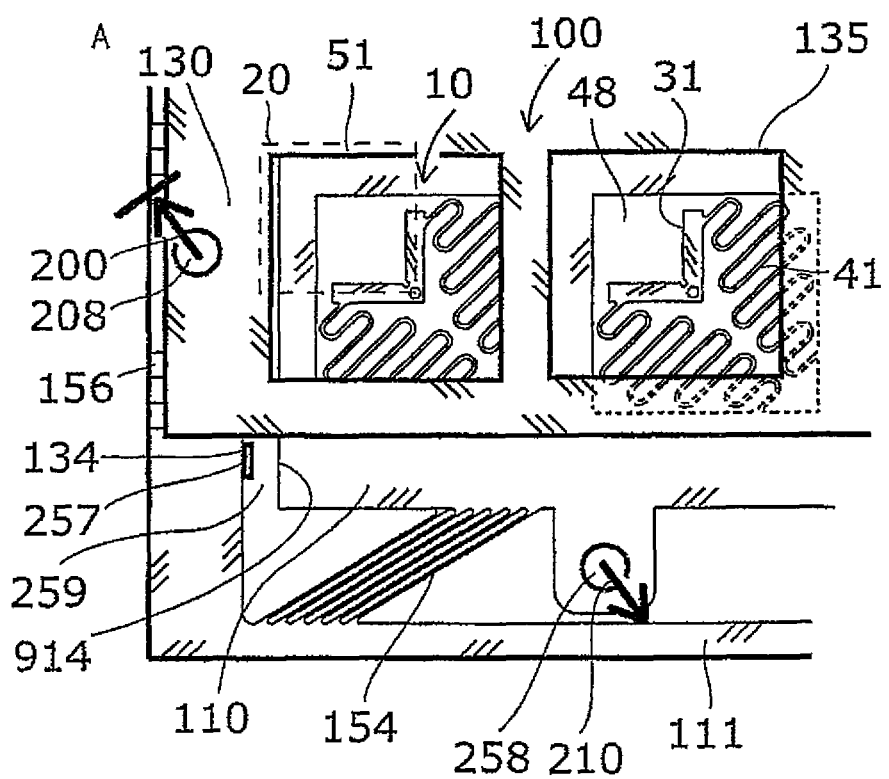

FIG. 5 and FIG. 6 show a view from above of a detail of a carrier 100, wherein the carrier 100 comprises a slidably elastic unit plate 110 elastically coupled to an elastic unit plate frame 111 via a plate connecting elastic unit 154. The elastic unit plate frame 111 is fixedly mounted at receiving plate 130. Thus, by bending the plate connecting elastic unit 154 the elastic unit plate 110 may slide relative to the receiving plate 130 having receiving openings 135 which delimit second abutting sections 51. First abutting sections 31 mounted at the elastic unit plate 110 via elastic units 41 may slide relative to the second abutting section 51 forming a fixed part of the receiving plate 130. A receptacle opening 48 of the receptacle 20 formed by the first abutting section 31 and the second abutting section 51 may be enlarged by sliding the elastic unit plate 110 relative to the receiving plate 130. By engaging elastic unit actuation hole 258 with actuation force 210 the elastic unit plate 110 may be slid relative to the receiving plate 130 and the elastic unit plate frame 111 since the receiving plate 130 and the elastic unit plate frame 111 may be fixed at fixing hole 208. An opposing force 200 may be applied in order to fix the carrier 100 against the force of the actuation force 210. At several fixing points 156 the receiving plate 130 and the elastic unit plate frame 111 may be fixedly coupled to each other.

Referring again to FIG. 5 a first plate abutting section 134 of the second plate 130 which may be denoted as receiving plate 130 and a second plate abutting section 914 of the first plate 110 which may be denoted as elastic unit plate 110 abut with each other. A spacer 257 may be adapted to regulate the size of the receptacle opening 48. When the first plate abutting section 134 and the second plate abutting section 914 abut with each other the clamping size of the receptacle formed by the first abutting section 31 and the second abutting section 51 may be reached. The size of the receptacle opening 48 may be smaller than the electronic component 1 to be received, so that the electronic component 1 may be clamped by the first abutting section 31 and the second abutting section 51. The space 259 between the elastic unit plate 110 and the elastic unit plate frame 111 may have the size of the spacer 257.

Referring to FIG. 6 a receiving size of the receptacle opening 48 is shown. The space 259 between the elastic unit plate 110 and the elastic unit plate frame 111 is enlarged. Therefore, also the size of the receptacle opening 48 may be enlarged to a size where the electronic component 1 may be received in the receptacle 20, i.e. in the space between the first abutting section 31 and the second abutting section 51.

Figure 7:
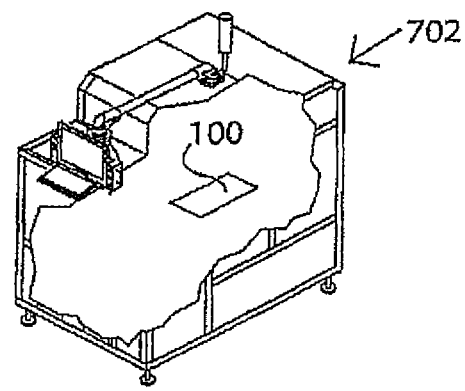
FIG. 7 shows a general view of a post-processing machine according to an exemplary embodiment of the invention.

FIG. 7 shows a general view of a post-processing machine 702 while a carrier 100 is located in the post-processing machine 702. The carrier 100 may be configured as described referring to FIG. 1 to FIG. 6 and may be subjected to a variety of operations in the post-processing machine 702.

Figure 8:
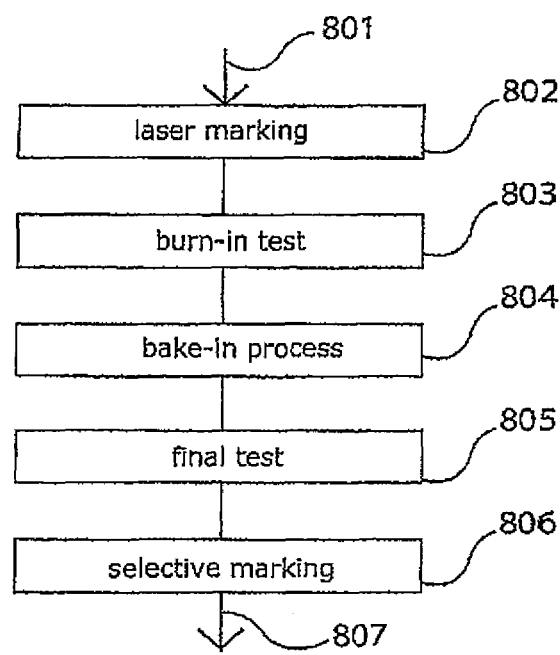
FIG. 8 shows a operation chart of a method according to an embodiment of the invention.

FIG. 8 shows an operation chart of a post-processing method according to an embodiment of the invention. The method may comprise placing 801 the carrier in a first post-processing machine. The first post-processing machine to which the carrier is subjected may be a laser marking machine performing laser marking 802 on the electronic components. Laser marking may be operated using the carrier by directing the laser beam through access holes of the carrier. A burn-in test 803 performed by a burn-in test machine may be operated subsequently since the carrier may be formed from spring metal steel and so allowing for subjecting the carrier to high temperatures for a long period of time. The carrier may stay dimensionally stable despite high temperatures up to 200° C. Due to the aligning method the electronic components are subjected to in the carrier the electronic components may be contacted and powered with electrical load. Subsequently, a bake-in process 804 may be performed by a bake-in machine. The carrier may be appropriate for bake-in of the electronic components since the carrier may be temperature-stable and may have a defined surface resistivity. A variety of forms of tests may denote a final test 805 of electronic components. The final test 805 may be an electrical quality test of the electronic components under different conditions. However, the method of post-processing may continue with selective marking 806 after the bake-in process 804. The carrier may be removed 807 of any of the respective post-processing machine after the laser marking 802, the burn-in process 803, the bake-in process 804, the final test 805 and the selective marking 806.

Figure 9:
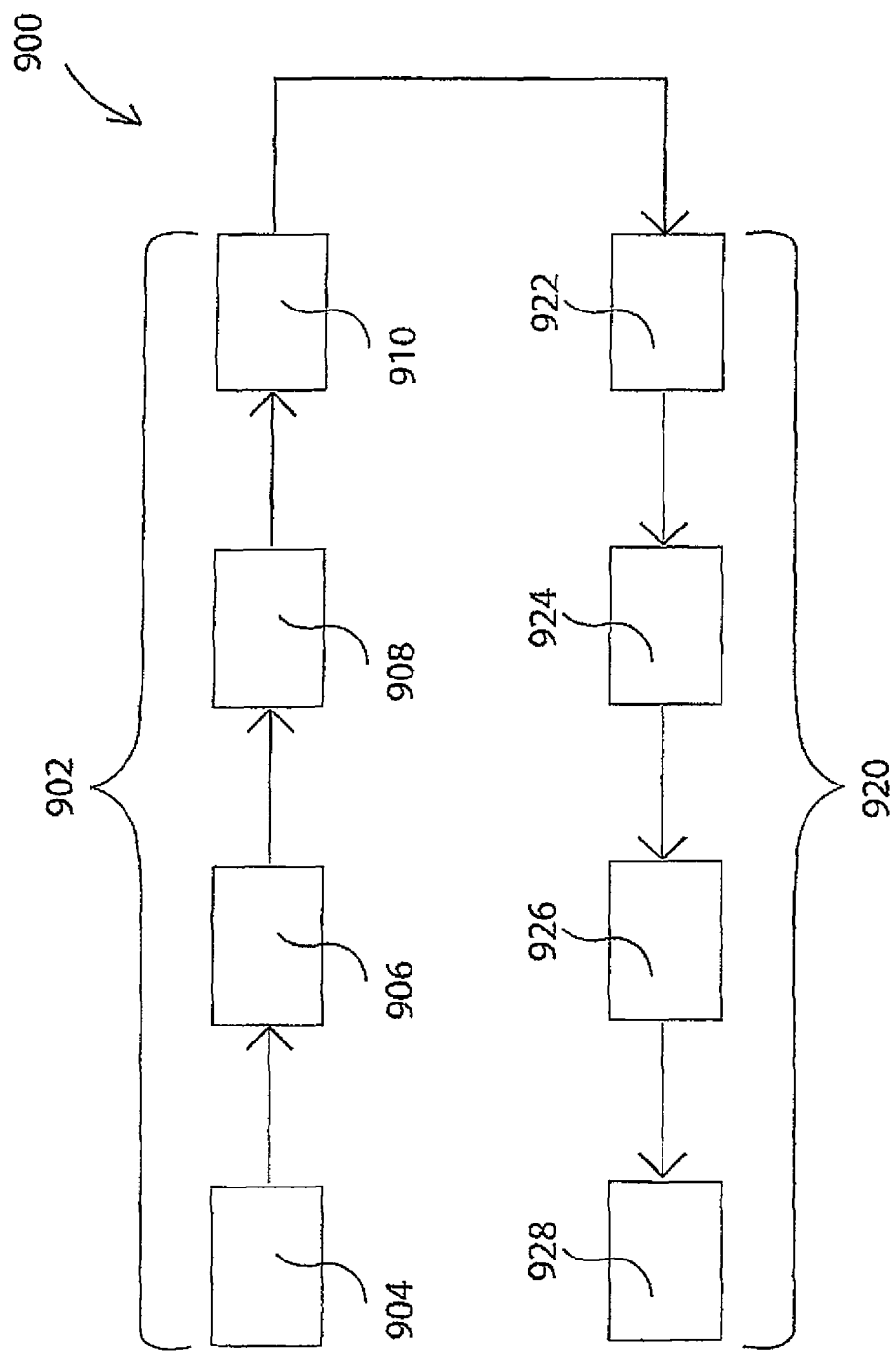
FIG. 9 shows a line according to an embodiment of the invention.

FIG. 9 shows a line 900 according to an embodiment of the invention. The line 900 is configured for manufacturing and post-processing of multiple electronic components using a carrier as described above.

The line 900 comprises a fabrication apparatus 902 for fabrication of packaged electronic chips. The fabrication apparatus 902 comprises a process chamber 904 for the formation of integrated circuit components on and/or in a silicon wafer. The fabrication apparatus 902 further comprises a metallization formation block 906 for the formation of metallization layer on the processed silicon wafer. The fabrication apparatus 902 further comprises a singularization unit 908 for singularizing the processed and metallized silicon wafer into individual naked dies. A packaging section 910 serves for packaging the singularized dies in a package which finishes formation of the electronic components. The fabrication apparatus 902 may finish the fabrication of the electronic components with finishing of contact pattern on the electronic devices.

Downstream of the fabrication apparatus 902 and after finishing of the contact pattern, a post-processing section 920 is arranged comprising a plurality of post-processing machines for applying post-processing to the readily fabricated packaged dies. The post-processing section 920 comprises a laser marking unit 922, a burn-in test unit 924, a bake-in test unit 926, and a selective marking unit 928. During post-processing, multiple packaged chips remain clamped within the carrier.

It should be noted that the term "comprising" does not exclude other elements or steps and the "a" or "an" does not exclude a plurality. Also elements described in association with different embodiments may be combined. It should also be noted that reference signs in the claims shall not be construed as limiting the scope of the claims. Implementation of the invention is not limited to the preferred embodiments shown in the figures and described above. Instead, a multiplicity of variants are possible which use the solutions shown and the principle according to the invention even in the case of fundamentally different embodiments.

What is claimed is:

1. A method of post-processing a plurality of electronic components in a post-processing machine after fabrication of the electronic components, comprising the steps of;
   providing a carrier with align fixtures, which align fixtures comprise a clamping mechanism;
   actuating the clamping mechanism to enlarge a size of receptacles, wherein each of the receptacles is assigned to one of the align fixtures and wherein the enlarged receptacles are larger than the electronic components to be received;
   positioning the electronic components in the enlarged receptacles of the align fixtures;
   actuating the clamping mechanism to reduce a size of the receptacles so that the electronic components are clamped and aligned with the receptacles of the carrier;
   wherein the electronic components are exclusively clamped on side sections in a self-acting manner by elastic units being integrally formed from a plate, and wherein the electronic components are aligned in the receptacles by the clamping force exerting two angled force components on the side sections of the electronic components;
   placing the carrier in the post-processing machine; and
   subjecting the electronic components to an operation of the post-processing machine while the electronic components are maintained in aligned positions in the receptacles of the carrier;
   wherein the step of subjecting the electronic components to the operation of the post-processing machine comprises a burn-in test while the electronic components are held and aligned by the carrier and are moved by handling the carrier.

2. A post-processing machine for post-processing a plurality of electronic components comprising:
   a carrier with align fixtures having a clamping mechanism;
   wherein the clamping mechanism is actuatable to enlarge a size of receptacles, wherein each of the receptacles is assigned to one of the align fixtures and wherein the enlarged receptacles are larger than the electronic components to be received;
   wherein the electronic components are positionable in the enlarged receptacles of the align fixtures; and wherein the clamping mechanism is actuatable to reduce a size of the receptacles so that the electronic components are clamped and aligned within the receptacles of the carrier;
   wherein the electronic components are exclusively clamped on side sections in a self-acting manner by elastic units being integrally formed from a plate, and wherein the electronic components are aligned in the receptacles by the clamping force exerting two angled force components on the side sections of the electronic components;
   wherein there is a place for the carrier during an operation in the post-processing machine;
   wherein the electronic components are subjected to the operation of the post-processing machine while the electronic components are maintained in aligned positions in the receptacles of the carrier; and wherein the step of subjecting the electronic components to the operation of the post-processing machine comprises a burn-in test while the electronic components are held and aligned by the carrier and are moved by handling the carrier.

\* \* \* \* \*